United States Patent
Matsuo et al.

(10) Patent No.: US 8,941,168 B2
(45) Date of Patent: Jan. 27, 2015

(54) SEMICONDUCTOR DEVICE INCLUDING A MULTILAYERED INTERELECTRODE INSULATING FILM

(75) Inventors: Kazuhiro Matsuo, Mie (JP); Masayuki Tanaka, Kanagawa (JP); Hirofumi Iikawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 13/423,633

(22) Filed: Mar. 19, 2012

(65) Prior Publication Data

US 2013/0069142 A1 Mar. 21, 2013

(30) Foreign Application Priority Data

Sep. 20, 2011 (JP) ................. 2011-204560

(51) Int. Cl.
| | | |
|---|---|---|
| H01L 29/788 | (2006.01) | |
| H01L 29/423 | (2006.01) | |
| H01L 21/28 | (2006.01) | |
| H01L 27/115 | (2006.01) | |
| H01L 29/66 | (2006.01) | |
| H01L 21/762 | (2006.01) | |

(52) U.S. Cl.
CPC .... *H01L 29/42324* (2013.01); *H01L 21/28273* (2013.01); *H01L 27/11521* (2013.01); *H01L 29/66825* (2013.01); *H01L 29/7881* (2013.01); *H01L 21/76232* (2013.01)
USPC ........... 257/316; 257/324; 257/326; 438/261; 438/257

(58) Field of Classification Search
CPC ............ H01L 27/115; H01L 27/11521; H01L 21/28273; H01L 29/66825; H01L 29/788; H01L 27/11517; H01L 11/11536; H01L 27/11541

USPC ......... 257/314, 315, 316, 324, 325, 326, 296, 257/321, 334; 438/424, 591, 593, 261, 257, 438/201, 211
See application file for complete search history.

(56) References Cited

U.S. PATENT DOCUMENTS

| | | | |
|---|---|---|---|
| 7,612,404 B2 | 11/2009 | Yamamoto et al. | |
| 7,833,856 B2 * | 11/2010 | Tanaka et al. | 438/201 |
| 2008/0277716 A1 | 11/2008 | Nishida et al. | |
| 2009/0173989 A1* | 7/2009 | Yaegashi | 257/320 |
| 2010/0308393 A1 | 12/2010 | Matsuo et al. | |

OTHER PUBLICATIONS

U.S. Appl. No. 13/237,486, filed Sep. 20, 2011, Kazuhiro Matsuo, et al.

* cited by examiner

*Primary Examiner* — Thanh Y Tran
(74) *Attorney, Agent, or Firm* — Oblon, Spivak, McClelland, Maier & Neustadt, L.L.P.

(57) ABSTRACT

A semiconductor device includes an element isolation region having an element isolation insulating film therein; an active region delineated by the element isolation region; agate insulating film formed in the active region; a charge storage layer above the gate insulating film; and an interelectrode insulating film. The interelectrode insulating film is formed in a first region above an upper surface of the element isolation insulating film, a second region along a sidewall of the charge storage layer, and a third region above an upper surface of the charge storage layer. The interelectrode insulating film includes a stack of a first silicon oxide film, a first silicon nitride film, a second silicon oxide film, and a second silicon nitride film. A control electrode layer is formed above the interelectrode insulating film. The second silicon oxide film is thinner in the first region than in the third region.

4 Claims, 9 Drawing Sheets

SEMICONDUCTOR DEVICE INCLUDING A MULTILAYERED INTERELECTRODE INSULATING FILM

CROSS-REFERENCE TO RELATED APPLICATION(S)

This application is based upon and claims the benefit of priority from Japanese Patent Application No. 2011-204560, filed on, Sep. 20, 2011 the entire contents of which are incorporated herein by reference.

FIELD

Embodiments disclosed herein generally relate to a semiconductor device and a method of manufacturing the same.

BACKGROUND

A flash memory is typically configured by an array of multiplicity of memory cells aligned in the word line direction and the bit line direction. A memory cell is configured by a stacked gate structure in which a floating gate electrode, interelectrode insulating film, and control gate electrode are stacked in the listed sequence. As flash memory increases its storage capacity through densification, features within the memory cell are packed in tighter dimensions. Dimensions typically affected by the densification are widths of floating gate electrodes and element isolation trenches.

The interelectrode insulating film is often configured by an ONO structure in which a silicon nitride film is interposed between a top silicon oxide film and a bottom silicon oxide film. The silicon nitride film in the middle layer of the stack traps electrons that positively affect the programming properties of the cell. As the element isolation trenches become narrower, the electrons trapped in the silicon nitride film of the interelectrode insulating film located above the element isolation insulating film cause a shift in the programming threshold of the adjacent cell, which typically causes programming errors. Further, in attempt to improve the coupling ratio, the control gate electrode is typically formed extensively to almost reach the foot of each floating gate electrode so as to nearly fill the word line direction gaps between the floating gate electrodes. As a result, the control gate electrode is placed in close proximity with the element isolation insulating film. An erase operation performed under such configuration caused flow of leakage current between the control gate electrode and the silicon substrate located in the region corresponding to the element isolation insulating film, thereby degrading the erase properties of the memory cells.

DETAILED DESCRIPTION

In one embodiment, a semiconductor device is disclosed. The semiconductor device includes a semiconductor substrate; an element isolation region defined in the semiconductor substrate and having an element isolation insulating film formed therein; an active region defined in the semiconductor substrate delineated by the element isolation region; a gate insulating film formed in the active region; a charge storage layer formed above the gate insulating film; and a multilayered interelectrode insulating film. The interelectrode insulating film is formed in a first region above an upper surface portion of the element isolation insulating film, a second region along a sidewall portion of the charge storage layer, and a third region above an upper surface portion of the charge storage layer. The interelectrode insulating film includes a stack of a first silicon oxide film, a first silicon nitride film, a second silicon oxide film, and a second silicon nitride film. A control electrode layer is formed above the interelectrode insulating film. The second silicon oxide film is thinner in the first region than in the third region.

In one embodiment, a method of manufacturing a semiconductor device is disclosed. The method includes forming a gate insulating film above a semiconductor substrate; forming a charge storage layer above the gate insulating film; forming an element isolation trench into the charge storage layer, the gate insulating film, and the semiconductor substrate; filling the element isolation trench with an element isolation insulating film; exposing an upper surface and an upper sidewall of the charge storage layer; and forming a multilayered interelectrode insulating film. The interelectrode insulating film is formed in a first region above an upper surface portion of the element isolation insulating film, a second region along a sidewall portion of the charge storage layer, and a third region above an upper surface portion of the charge storage layer. The interelectrode insulating film includes a first silicon oxide film, a first silicon nitride film above the first silicon oxide film, a second silicon oxide film above the first silicon nitride film so as to be thicker in the third region than in the first region. The method further includes isotropically etching or nitriding the second silicon oxide film such that the second silicon oxide film in the first region is 1 nm or thinner, and forming a control electrode layer above the interelectrode insulating film.

Embodiments are described hereinafter with reference to the accompanying drawings. Elements that are identical or similar are represented by identical or similar reference symbols across the figures. The drawings are not drawn to scale and thus, do not reflect the actual measurements of the features such as the correlation of thickness to planar dimensions and the relative thickness of different layers.

Figure 1:
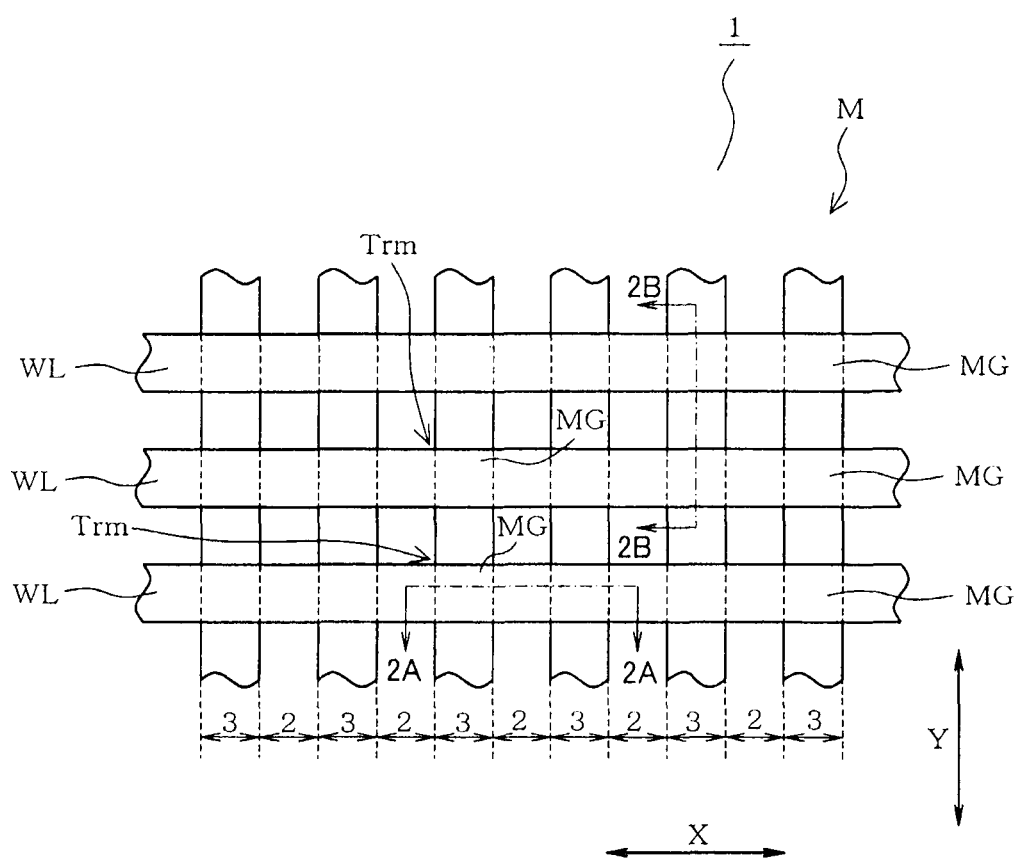
FIG. 1 schematically illustrates the planar structure of a memory cell region of a first embodiment.

A first embodiment of a semiconductor device is described through an example of a nonvolatile semiconductor storage device. FIG. 1 schematically illustrates the planar structure of a memory cell region of the nonvolatile semiconductor storage device. As shown in FIG. 1, memory cell region M contains multiplicity of memory cell transistors Trm in a matrix alignment along the word line WL direction X and the bit line direction Y. A peripheral circuit not shown reads, programs, and erases the data stored in memory cell transistors Trm. NAND flash memory is a typical example of a nonvolatile semiconductor storage device employing such memory cell structure. NAND flash memory is typically configured by an array of NAND strings or units of cells in which a plurality of memory cell transistors Trm are series connected between a pair select transistors not shown.

Figure 2A:
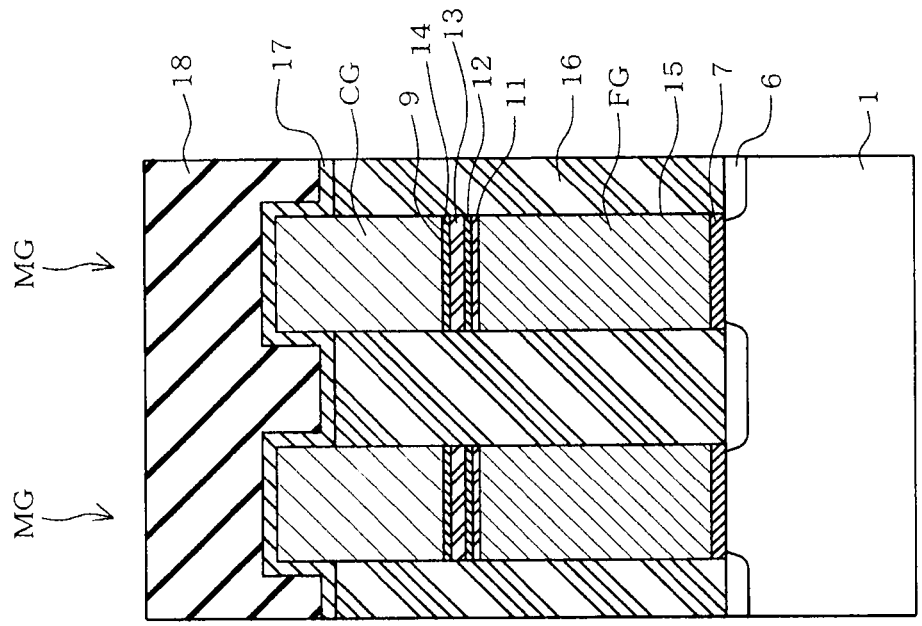
FIG. 2A is a cross sectional view taken along line 2A-2A of FIG. 1.
Figure 2B:
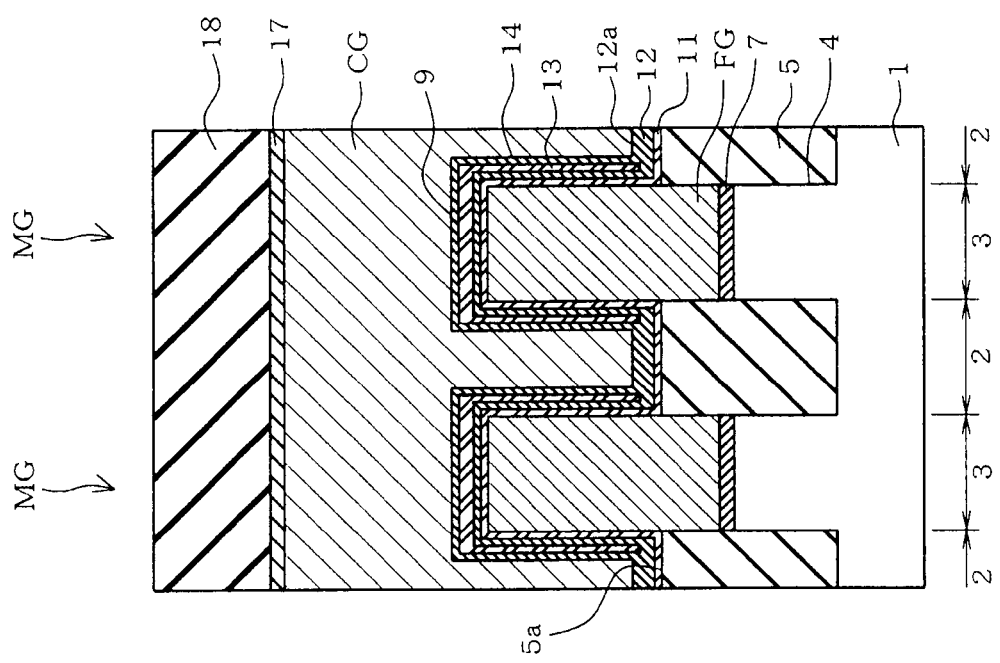
FIG. 2B is a cross sectional view taken along line 2B-2B of FIG. 1.

FIG. 2A is a cross sectional view taken along line 2A-2A of FIG. 1 which extends along word line WL and the width direction of the channel of each memory cell. FIG. 2B is a cross sectional view taken along line 2B-2B of FIG. 1 which extends along the bit line and the length direction of the channel of each memory cell. The gate electrode structure within memory cell region M of the first embodiment is discussed with reference to FIGS. 2A and 2B.

As can be seen in FIGS. 2A and 2B the P-type silicon substrate 1 has element isolation trenches 4 formed in its surface layer. Element isolation trenches 4 isolate multiplicity of active regions 3 in word line WL direction as viewed in FIG. 1. Each element isolation trench 4 is filled with element isolation insulating film 5 to form element isolation region 2 employing an STI (Shallow Trench Isolation) scheme.

Memory cell transistor Trm includes an n-type diffusion layer 6 formed in silicon substrate 1, gate insulating film 7 formed above silicon substrate 1, and gate electrode MG formed above gate insulating film 7. Gate electrode MG includes floating gate electrode FG serving as a charge storage layer, interelectrode insulating film 9 formed above floating gate electrode FG, and control gate electrode CG serving as a control electrode layer. Diffusion layer 6 is formed in the surface layer of silicon substrate 1 situated beside gate electrode MG of memory cell transistor Trm and serves as the source/drain region of memory cell transistor Trm.

Gate insulating film 7 also referred to as tunnel insulating film 7, is formed in active region 3 which is delineated by element isolation insulating film 5 filled in the element isolation trenches 4. Gate insulating film 7 typically comprises a silicon oxide film. Floating gate electrode FG formed above gate insulating film 7, serving as a charge storage layer as described earlier, typically comprises polycrystalline silicon layer 8 also referred to as conductive layer 8 doped with impurities such as phosphorous.

Interelectrode insulating film 9 takes a multilayered ONON structure in which a layer of first silicon oxide film 11, a layer of first silicon nitride film 12, a layer of second silicon oxide film 13 and a layer of second silicon nitride film 14 are stacked in the listed sequence above upper surface 5a of element isolation insulating film 5 and the sidewall and the upper surface of floating gate electrode FG. Interelectrode insulating film 9 may also be referred to as an interpoly insulating film and inter-conductive-layer insulating film. As will be later described in detail, second silicon oxide film 13 is removed or dissipated from the region above upper surface 5a of element isolation insulating film 5 and thus, a thick layer of silicon nitride film 12a, resulting from a stack of first silicon nitride film 12 and second silicon nitride film 14, resides above upper surface 5a. Stated differently, interelectrode insulating film 9 takes an ON structure in the region above upper surface 5a of element isolation insulating film 5 where silicon nitride film 12a at the top of the stack is placed in direct physical contact with control gate electrode CG.

Control gate electrode CG formed above interelectrode insulating film 9 comprises conductive layer 10. In other words, conductive layer 10 serves globally as word line WL extending across the memory cell array and locally as control gate electrode CG for each memory cell. Conductive layer 10 is typically configured as a stack of a polycrystalline silicon layer doped with impurities such as phosphorous and a silicide layer residing directly on top of the polycrystalline silicon layer. The silicide layer comprises a silicide of either of metals such as tungsten (W), cobalt (Co), and nickel (Ni). The silicide layer of the first embodiment employs a nickel silicide (NiSi). In an alternative embodiment, conductive layer 10 may be fully silicided.

As can be seen in FIG. 2B, gate electrodes MG of memory cell transistors Trm are electrically isolated in the Y direction by gaps 15. Gaps 15 are filled with inter-memory-cell insulating film 16 which typically comprises a silicon oxide film such as TEOS (tetraethyl orthosilicate) or a low dielectric constant insulating film.

Above the upper surface of inter-memory-cell insulating film 16, and the upper surface and the upper sidewall of control gate electrode CG, liner insulating film 17 is formed which comprises, for example, a silicon nitride film. Further above liner insulating film 17, interlayer insulating film 18 is formed which comprises a silicon oxide film. Liner insulating film 17 serves as a barrier to keep the oxidation agent used in the formation of interlayer insulating film 18 away from control gate electrode CG. One of the advantages of providing liner insulating film 17 is that it prevents oxidation of the silicide layer of conductive layer 10 which may cause elevation in the resistance level of word line WL. Because liner insulating film 17, comprising a silicon nitride film in the first embodiment, does not fully fill gap 15 between control gate electrode CG, the risk of increased parasitic capacitance that may lead to wiring delay can be minimized.

The above described nonvolatile semiconductor storage device is configured to erase/program the data stored in the memory cell by applying high electric field, drawn from the peripheral circuit not shown, between word line WL and P-well of silicon substrate 1 as well as applying suitable predetermined voltage on electric elements such as the source and drain. For instance, when programming, the peripheral circuit applies a high level voltage on the selected word line WL while applying a low level voltage on P-well, etc., provided in silicon substrate 1. When erasing, the peripheral circuit applies a low level voltage on the selected word line WL while applying a high level voltage on P-well, etc. of silicon substrate 1.

Figure 12:
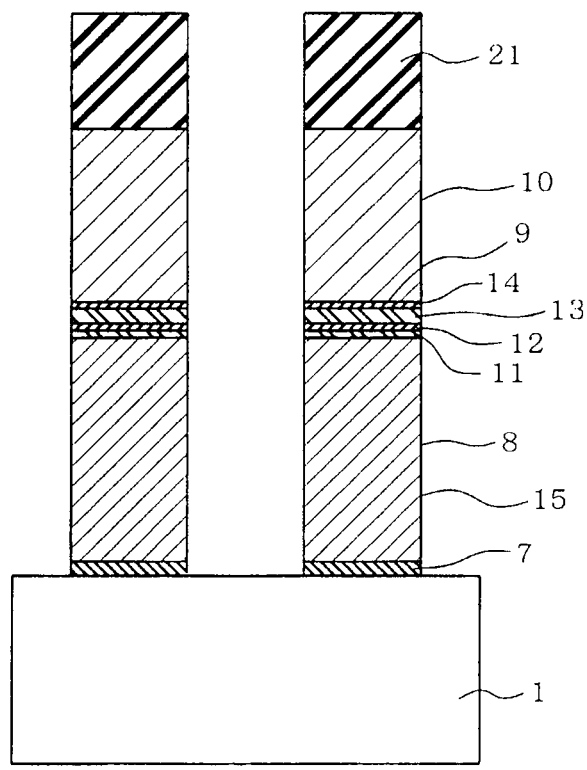
FIG. 12 depicts a cross section taken along line 2B-2B of FIG. 1 and illustrates one phase of a manufacturing process flow of the memory cell region.

Referring to FIGS. 3 to 12, a description will be given on the process flow for manufacturing the above described nonvolatile semiconductor storage device. FIGS. 3 to 11 are cross sectional views of memory cell region M taken along line 2A-2A of FIG. 1 at different stages of the manufacturing process flow. FIG. 12 is a cross sectional view of memory cell region M taken along line 2B-2B of FIG. 1.

Figure 3:
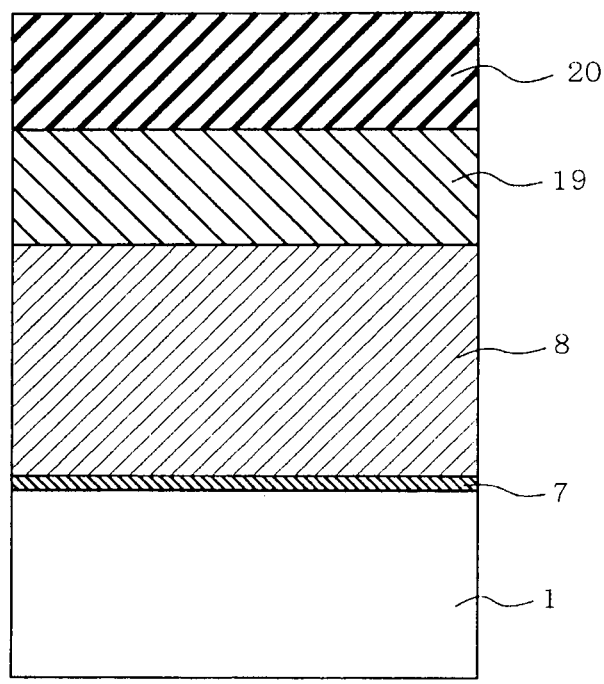
FIGS. 3, 4, 5, 6, 7, 8, 9, 10, and 11 each depict a cross section taken along line 2A-2A of FIG. 1 and illustrate one phase of a manufacturing process flow of the memory cell region.

Referring to FIG. 3, approximately 6 nm of gate insulating film 7 is formed above the upper surface of silicon substrate 1 which is doped with impurities. Gate insulating film 7 serves as a tunnel insulating film. Then, above gate insulating film 7, approximately 100 nm of polycrystalline silicon layer 8 doped with phosphorus is formed by CVD (Chemical Vapor Deposition). Polycrystalline silicon layer 8, as described earlier, constitutes floating gate electrode FG that serves the charge storage layer.

Then, silicon nitride film 19 later used as a mask is formed by CVD which is followed by CVD formation of another mask made of silicon oxide film 20. Silicon oxide film 20 is thereafter coated with a photoresist not shown which is subsequently patterned through exposure and development.

Figure 4:
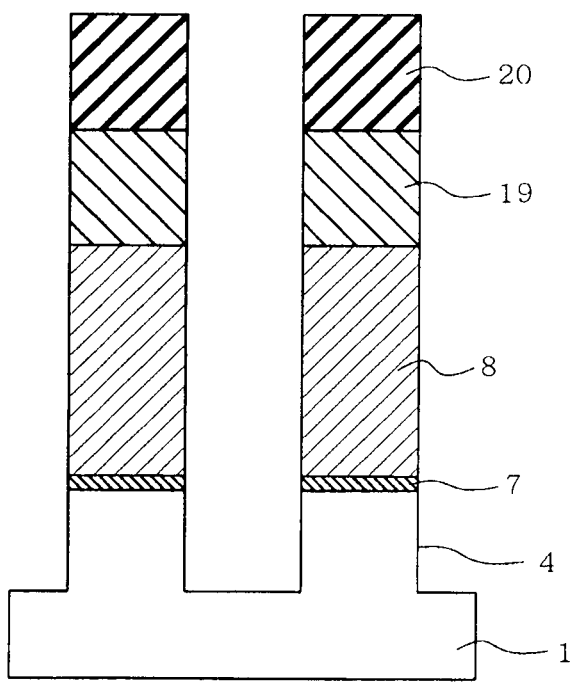

Then, using the patterned photoresist as a mask also referred to as a first resist mask hereinafter, the underlying silicon oxide film 20 is etched by RIE (Reactive Ion Etching). Photoresist is thereafter removed and silicon oxide film 20 is further used as a mask to etch the underlying silicon nitride film 19 by RIE, which is in turn used as a mask to etch polycrystalline silicon layer 8, gate insulating film 7, and silicon substrate 1 to form element isolation trench 4 as can be seen in FIG. 4. According to the first embodiment, the widths of both active region 3 and element isolation trench 4 are configured at approximately 50 nm.

Figure 5:
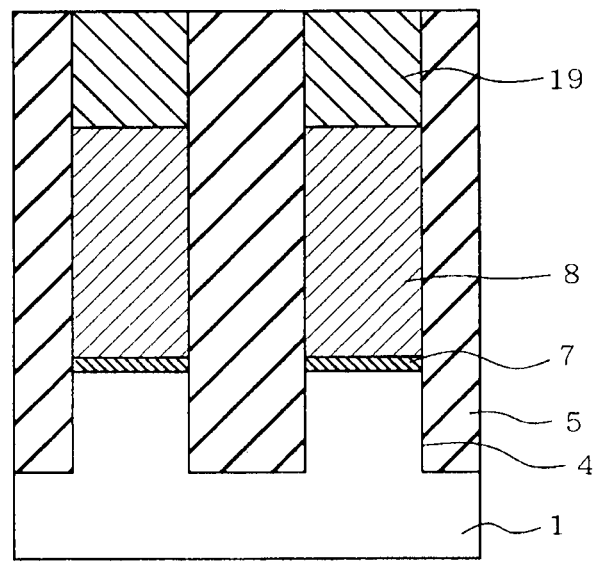
Figure 6:
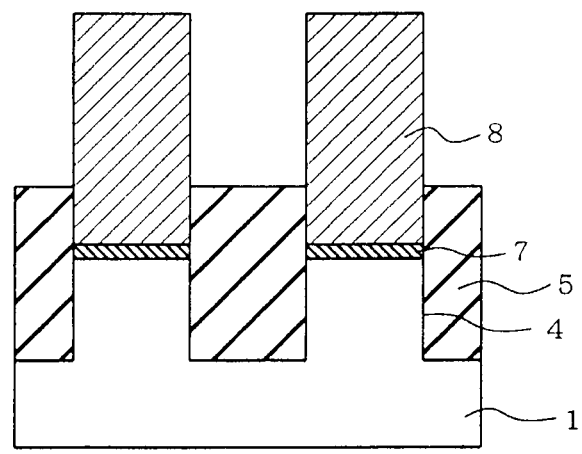

Then, element isolation trench 4 is overfilled with element isolation insulating film 5 such that the overflow of element isolation insulating film 5 is further blanketed over silicon oxide film 20. Element isolation insulating film 5 comprises a silicon oxide film typically formed by SOG (Spin On Glass) materials such as polysilazane. Then, silicon oxide film 20 is thereafter polished away by CMP (Chemical Mechanical Polishing) using the underlying silicon nitride film 19 as a polish stop to remove the excess element isolation insulating film 5 while leaving element isolation insulating film 5 within element isolation trench 4 as shown in FIG. 5.

Then, silicon nitride film 19, used as an etch mask and a polish stop, is removed by wet etching to expose the upper surface of polycrystalline silicon layer 8. Further, the upper portion of element isolation insulating film 5 is removed by wet etching typically employing a solution of diluted hydrofluoric acid. The element isolation insulating film 5 in memory cell region M in particular is etched until approximately 50 nm of the upper sidewall of polycrystalline silicon layer 8 is exposed to obtain the structure shown in FIG. 6.

Figure 7:
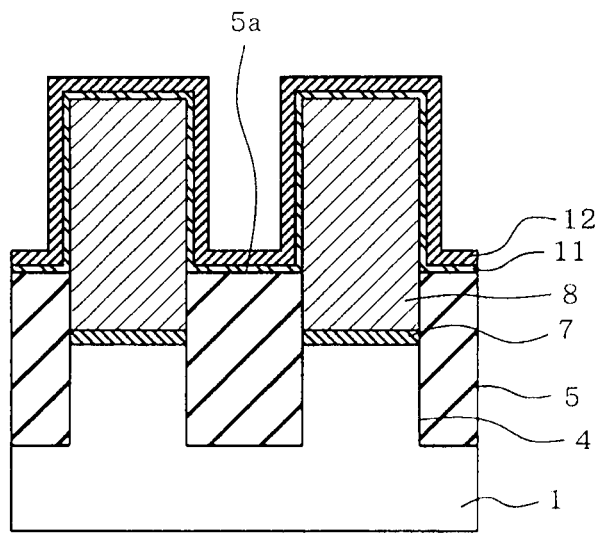

Next, as shown in FIGS. 7 to 10, interelectrode insulating film 9 is blanketed above the underlying structure i.e. upper surface 5a of element isolation insulating film 5, and the upper sidewall and the upper surface of polycrystalline silicon layer 8 later formed into floating gate electrode FG. More specifically, first silicon oxide film 11 and first silicon nitride film 12 are stacked in the listed sequence typically by LP-CVD (Low Pressure Chemical Vapor Deposition) as shown in FIG. 7.

Figure 8:
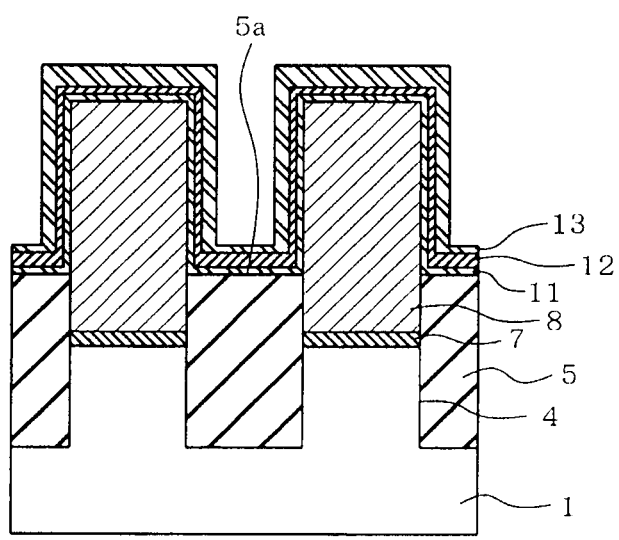
Figure 9:
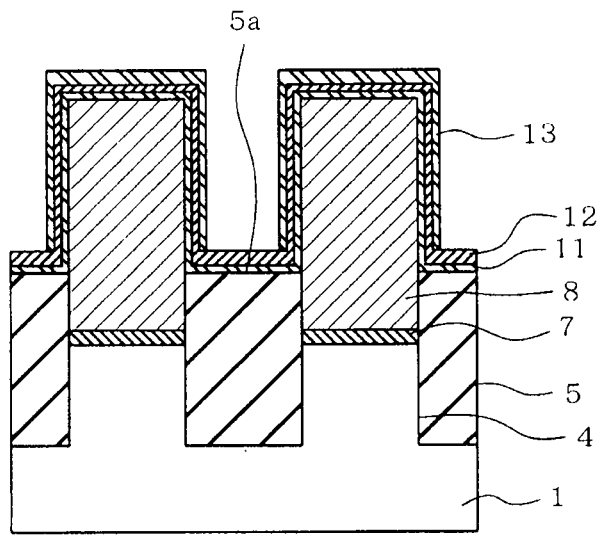
Figure 10:
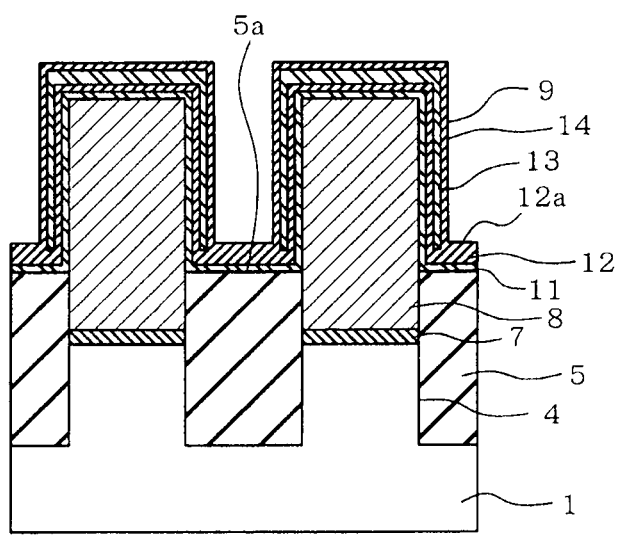
Figure 11:
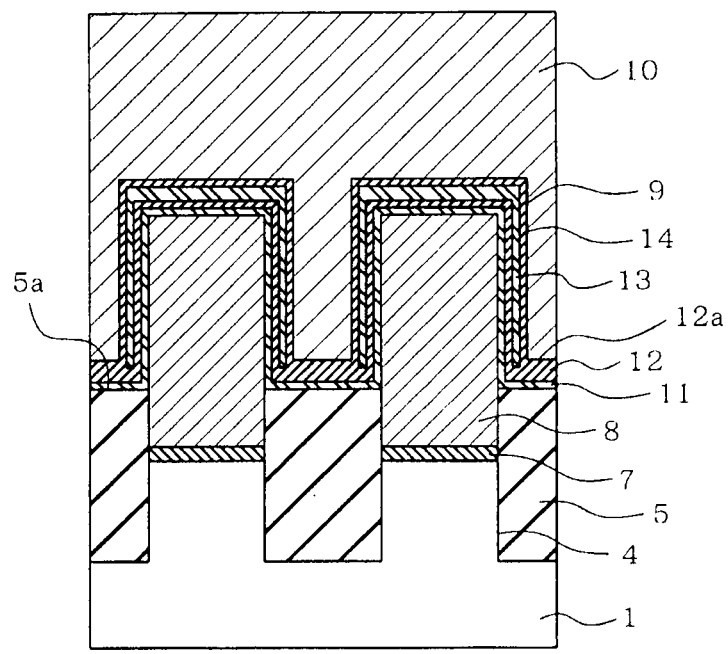

Next, as shown in FIG. 8, first silicon nitride film 12 is locally oxidized to form second silicon oxide film 13 being relatively thick in the region above the upper surface of floating gate electrode FG and relatively thin in the region along the sidewall of floating gate electrode FG and above upper surface 5a of element isolation insulating film 5. Then, as shown in FIG. 9, second silicon oxide film 13 above upper surface 5a of element isolation insulating film 5 is removed by isotropic etching such as wet etching to expose the underlying first silicon nitride film 12. Next, second silicon nitride film 14 is formed, for instance, by radical nitridation to obtain the structure illustrated in FIG. 10. As can be seen in FIG. 10, interelectrode insulating film 9 located above the upper surface and along the sidewall of floating gate electrode FG takes an ONON structure comprising a stack of first silicon oxide film 11/first silicon nitride film 12/second silicon oxide film 13/second silicon nitride film 14. In contrast, interelectrode insulating film 9 located above upper surface 5a of element isolation insulating film 5 takes an ON structure comprising a stack of first silicon nitride film 12 and second silicon nitride film 14 forming a thick layer of silicon nitride film 12a since second silicon oxide film 13 is removed from the stack.

The radical nitridation employed in forming second silicon nitride film 14 generates plasma using microwaves in a nitrogen gas containing atmosphere to cause reaction of nitrogen radicals and nitrogen ions that produce a silicon nitride film.

Further, the first embodiment employs plasma oxidation in locally oxidizing first silicon nitride film 12. To elaborate on the plasma oxidation, plasma is generated using microwaves in an oxygen gas containing atmosphere controlled to low pressures ranging from 10 to 300 Pa that produce oxygen radicals and oxygen ions for locally oxidizing first silicon nitride film 12. The local oxidation forms second silicon oxide film 13 which is relatively thick in the region above the upper surface of floating gate electrode FG and relatively thin in the region along the sidewall of floating gate electrode FG and above upper surface 5a of element isolation insulating film 5. The amount and the locality of the oxidation, which is reflected in the foregoing location based dimensions of the second silicon oxide film 13, can be controlled by fine tuning the recipe of the plasma oxidation.

After forming interelectrode insulating film 9, a phosphorous-doped polycrystalline silicon layer 10 serving as control gate electrode CG is formed by LP-CVD in the thickness of approximately 100 nm. Thus, the resulting control gate electrode CG is placed in direct contact with silicon nitride films 12 and 14 of interelectrode insulating film 9, represented as a combined silicon nitride film 12a located in the region above upper surface 5a of element isolation insulating film 5.

Referring now to FIG. 12, silicon nitride film 21 is formed above polycrystalline silicon layer 10 by CVD that serves as a mask in the subsequent RIE. Further above silicon nitride film 21, a second resist mask not shown is formed which contains patterns that are oriented orthogonal to the patterns of the first resist mask mentioned earlier. Then, using the second resist mask, silicon nitride film 21, polycrystalline silicon layer 10, interelectrode insulating film 9, polycrystalline silicon layer 8, and gate insulating film 7 are etched in the listed sequence to form gap 15 for electrode isolation as shown in FIG. 12. The above series of processes form the stacked gate structure composed of floating gate electrode FG, interelectrode insulating film 9, and control gate electrode CG. The width of each stacked gate structure as well as the spacing between the stacked gate structures are approximately 50 nm.

Then, a spacer film not shown being approximately 10 nm thick is formed along the sidewall of the gate structure by thermal oxidation and CVD. Using the spacer film as a mask, impurity diffusion layer 6 shown in FIG. 2B, serving as the source/drain region, is formed by ion implantation and thermal anneal. Then, within gap 15, inter-memory-cell insulating film 16 is formed which is thereafter planarized and lowered in elevation. Further, the upper portion of polycrystalline silicon layer 10 is formed into a nickel silicide layer, followed by formation of liner insulating film 17 and interlayer insulating film 18 as shown in FIG. 2B. Then, known techniques are used to form interconnects, etc. not shown.

The end result of the above described process flow provides a nonvolatile semiconductor storage device configured by gate insulating film 7 formed above silicon substrate 1, floating gate electrode FG formed above gate insulating film 7, interelectrode insulating film 9 formed above floating gate electrode FG, control gate electrode CG formed above interelectrode insulating film 9, and impurity diffusion layer 6 formed beside the channel region located below floating gate electrode FG.

Each of the memory cells of such nonvolatile semiconductor storage device is typically erased/programmed by applying a high level voltage between silicon substrate 1 and control gate electrode CG, whereby electric field intensified in correlation with the coupling ratio is applied to gate insulating film 7 to cause tunneling current to flow through gate insulating film 7. Responsively, amount of stored charge within floating gate electrode FG is varied, causing a shift in the threshold voltage to either program or erase the memory cell. In operation, multiplicity of memory cells are aligned in a matrix along word lines WL and the bit lines.

One application of the nonvolatile semiconductor storage device configured as described above is a NAND flash memory in which a plurality of series connected memory cells are disposed between select transistors.

Next, a description will be given on the structure, operation and the advantages of interelectrode insulating film 9 configured as set forth in the first embodiment. Interelectrode insulating film 9 is configured such that first silicon nitride film 12 and second silicon nitride film 14 are combined into silicon nitride film 12a in the region above upper surface 5a of element isolation insulating film 5 and thus, silicon nitride film 12a establishes direct contact with control gate electrode CG. The direct contact between first silicon nitride film 12 and second silicon nitride film 14 and further between second silicon nitride film 14 and control gate electrode CG inhibits trapping of electrons within first silicon nitride film 12, thereby inhibiting threshold shifting of the adjacent cell that may cause erroneous programming. Further, the combined silicon nitride film 12a in direct contact with control gate electrode CG increases the distance traveled by the electrons tunneling from control gate electrode CG toward silicon substrate 1 during an erase operation as compared to a structure without a silicon nitride film placed in direct contact with control gate electrode CG. As a result, flow of leakage current between silicon substrate 1 and control gate electrode CG can be suppressed to improve the erase properties of the memory cells.

Post oxidation for curing RIE damages may be performed after forming gaps 15 shown in FIG. 12 for electrode isolation. In such case, oxidation agent may be introduced unwantedly into interelectrode insulating film 9 to form a bird's beak at the edge of the silicon oxide film lying above the upper surface of floating gate electrode FG. The bird's beak may reduce the coupling ratio and significantly impair the properties of the memory cell. To address such concerns, the first embodiment incorporates second nitride film 14 at the topmost layer of interelectrode insulating film 9 located above floating gate electrode FG to inhibit the formation of the bird's beak. Formation of an optional silicon nitride film at the bottommost layer of interelectrode insulating film 9 below first silicon oxide film 11 prevents formation of bird's beak even more effectively.

When second silicon nitride film 14 located above upper surface 5a of element isolation insulating film 5 is formed by plasma nitridation utilizing plasma enhanced nitrogen radicals, multiple energy levels originating from plasma damages are generated in addition to trap energy levels possessed by an ideal nitride film. Such additional energy levels may degrade the voltage tolerance of interelectrode insulating film 9. To address such concerns, a thin silicon oxide film which is 1 nm or thinner may be provided between second silicon nitride film 14 i.e. silicon nitride film 12a, and control gate electrode CG to prevent voltage tolerance degradation originating from the additional energy levels of the silicon nitride film. However, in case the impact of the electron traps present in the region above upper surface 5a of element isolation insulating film 5 on the adjacent memory cell is significant, second silicon nitride film 12a is desirably placed in direct contact with control gate electrode CG without the intervention of the silicon oxide film.

Interelectrode insulating film 9 of the first embodiment employs an ONON structure in the region above the upper surface of floating gate electrode FG. As a result, the high electric field applied to the upper surface of floating gate electrode FG during programming is relaxed to improve the programming properties of the memory cell as will be explained in more detail below.

Figure 13:
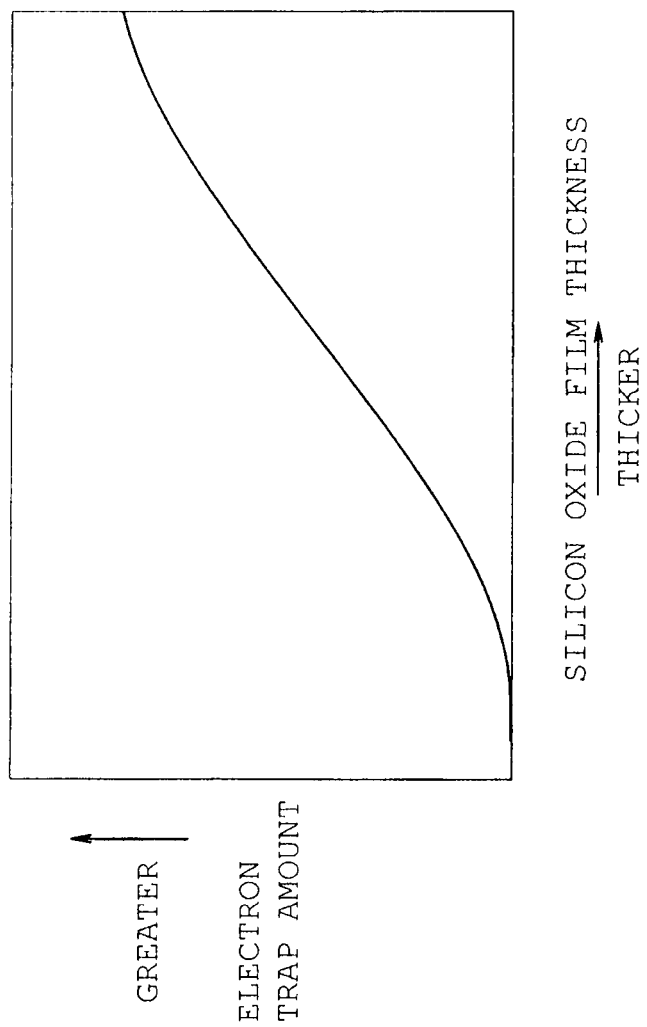
FIG. 13 is a chart plotting the thickness of a top silicon oxide film against the amount of electron traps in a middle silicon nitride film of an ONO stack.

FIG. 13 is a chart showing how the amount of electrons trapped in a middle silicon nitride film of an ONO stack varies with the thickness of the top silicon oxide film. FIG. 13 shows that the amount of electrons trapped in the silicon nitride film that helps improve the programming properties is reduced as the top silicon oxide film becomes thinner. This is an indication that the thickness of the top silicon oxide film, exhibiting relatively high level of barrier height, is desirably increased to trap sufficient amount of electrons into the silicon nitride film during the high electric field programming operation to improve the programming properties. In the first embodiment, second silicon oxide film 13 is configured to remain sufficiently thick above first silicon nitride film 12 in the region above the upper surface of floating gate electrode FG. As a result, the electrons trapped in first silicon nitride film 12 relaxes the electric field applied to the ONO structure in general, thereby reducing the flow of leakage current in the interelectrode insulating film 9 and improving the programming properties of the memory cell.

Figure 14:
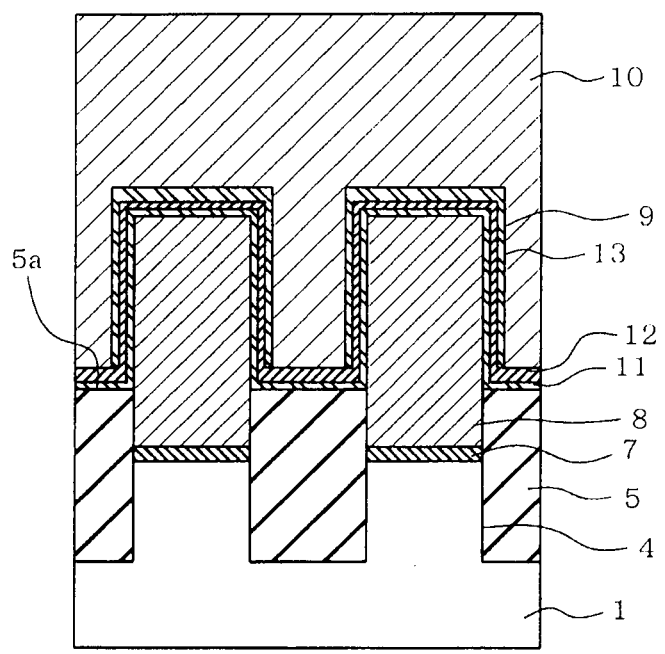
FIG. 14 illustrates a second embodiment and corresponds to FIG. 11.

FIG. 14 illustrates a second embodiment. The elements that are identical to those of the first embodiment are represented by identical reference symbols. The second embodiment differs from the first embodiment in that second silicon nitride film 14 is not formed. That is, as shown in FIG. 9, second silicon oxide film 13 is removed from upper surface 5a of element isolation insulating film 5 to expose first silicon nitride film 12, whereafter approximately 100 nm of the phosphorus-doped polycrystalline silicon layer 10 is formed which is later processed into control gate electrode CG.

Apart from the above described difference, the second embodiment is substantially the same in structure with the first embodiment. Accordingly, operation and the advantages of the second embodiment are substantially identical to those of the first embodiment. In the second embodiment, the absence of the silicon nitride film provided at the topmost layer of interelectrode insulating film 9 allows thinning of the physical thickness of interelectrode insulating film 9 as compared to the first embodiment. Because interelectrode insulating film 9 is lined along the gaps between the gate structures, a thinned interelectrode insulating film 9 relatively widens the gap between the adjacent gate structures and facilitates the filling of the gaps with polycrystalline silicon layer 10, later processed into control gate electrode CG. Further, the absence of the topmost silicon nitride film, having a higher dielectric constant relative to the silicon oxide film, in the region located above the upper surface and the sidewall of floating gate electrode FG allows interelectrode insulating film 9 to be controlled to the desired EOT (Equivalent Oxide Thickness). Thus, the coupling ratio can be maintained while reducing the physical thickness of interelectrode insulating film 9.

The foregoing embodiments may be modified or expanded as follows.

First silicon nitride film 12 being formed by LP-CVD in the first and the second embodiments may employ other deposition schemes such as ALD (Atomic Layer Deposition). Deposition is preferred over other schemes since the formed first silicon nitride film 12 is subsequently subjected to local oxidation to obtain second silicon oxide film 13. The Si source used in the LP-CVD and ALD of silicon nitride film may be inorganic materials such as disilane, DCS (Dichlorosilane, $SiH_2Cl_2$), or HCD (Hexa Chloro Dislane, $Si_2Cl_6$) or organic materials comprising a bond of Si and amino group. The N source may be $NH_3$ or radical nitrogen, etc.

ONON or ONO structure employed in interelectrode insulating film 9 of the first and the second embodiments may further incorporate an additional silicon nitride film in the bottommost layer of the stack to employ a NONON or a NONO structure. To achieve across wafer uniformity, ALD may be employed in forming the stack of silicon oxide and silicon nitride films.

Plasma oxidation i.e. the radical oxidation employed in the local oxidation of the first and the second embodiments may be replaced by other oxidation schemes as long as the oxidation can be localized. Local oxidation can be performed any number of times and in any amount to control the thickness of first silicon nitride film 12, second silicon oxide film 13, and consequently interelectrode insulating film 9 as desired.

Second silicon oxide film 13 formed by local oxidation of the underlying silicon nitride film may be deposited instead, in which case microloading effect can be utilized. For instance, an ordinary LP-CVD may be employed with elevated pressure to improve the deposition rate. Such configuration produces a silicon oxide film which is substantially identical in thickness configuration to second silicon oxide film 13. Still alternatively, a deposition scheme in which a flow of oxidation radicals and Si source are supplied alternately may be employed to obtain a silicon oxide film which is substantially identical in thickness configuration to second silicon oxide film 13. In case the silicon oxide film is formed by deposition instead of local oxidation of the underlying silicon nitride film, the underlying silicon nitride film, in this case, first silicon nitride film 12 is desirably formed in the thickness of the final structure since additional thickness to be expended on oxidation no longer needs to be taken into account.

In the first and the second embodiments, second silicon oxide film 13 was removed from the region above upper surface 5a of element isolation insulating film 5 by wet chemical etching. Alternatively, a dry chemical etching such as RIE that allows more precise etch controllability may be employed instead.

In the first embodiment, second silicon nitride film 14 was formed after etching away second silicon oxide film 13 located in the region above upper surface 5a of element isolation insulating film 5 obtained by locally oxidizing first silicon nitride film 12 as shown in FIG. 8. Alternatively, silicon oxide film 13 shown in FIG. 8 may be radically nitrided instead of being etched to obtain second silicon nitride film 14. The alternative approach will also successfully obtain second silicon nitride film 14 since second silicon oxide film 13 formed above upper surface 5a of element isolation insulating film 5 is thin enough to be readily dissipated by radical nitridation.

At this instance, the presence of a thin remainder second silicon oxide film 13 of 1 nm or less is permissible between first silicon nitride film 12 and second silicon nitride film 14 since such insignificant amount of remainder second silicon oxide film 13 will still allow reduction in the amount of electrons being trapped in first silicon nitride film 12 of interelectrode insulating film 9 as can be gathered from FIG. 13. Thus, the alternative approach will also achieve suppression of threshold shifting and erroneous programming of the adjacent cell. In contrast, second silicon oxide film 13 is relatively thickened in the region where interelectrode insulating film 9 is placed in contact with floating gate electrode FG. Thus, high electric field applied during the programming operation can be relaxed by the electrons trapped in first silicon nitride film 12, thereby reducing the flow of leakage current in the region above the upper surface of floating gate electrode FG and improving the programming properties of the cell. The second embodiment, which similarly dissipates second silicon oxide film 13 from the region above upper surface 5a of element isolation insulating film 5, may also be configured to leave a thin remnant of silicon oxide film of 1 nm or less.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   an element isolation region defined in the semiconductor substrate and having an element isolation insulating film formed therein;
   an active region defined in the semiconductor substrate delineated by the element isolation region;
   a gate insulating film formed in the active region;
   a charge storage layer formed above the gate insulating film;
   a multilayered interelectrode insulating film formed in a first region above an upper surface portion of the element isolation insulating film, a second region along a sidewall portion of the charge storage layer, and a third region above an upper surface portion of the charge storage layer, the interelectrode insulating film including a stack of a first silicon oxide film, a first silicon nitride film, a second silicon oxide film, and a second silicon nitride film; and
   a control electrode layer formed above the interelectrode insulating film;
   wherein the second silicon oxide film is thinner in the first region than in the third region.

2. The device according to claim 1, wherein the interelectrode insulating film further includes a silicon oxide film of 1 nm or thinner between the second silicon nitride film and the control electrode layer.

3. The device according to claim 1, wherein the interelectrode insulating film further includes a silicon nitride film between the first silicon oxide film and the charge storage layer.

4. The device according to claim 1, wherein the first silicon nitride film comprises a deposition film and the second silicon oxide film comprises a local oxidation of the first silicon nitride film.

* * * * *